United States Patent
Alessandria et al.

(10) Patent No.: US 7,205,607 B2
(45) Date of Patent: Apr. 17, 2007

(54) SEMICONDUCTOR POWER DEVICE WITH INSULATED GATE AND TRENCH-GATE STRUCTURE AND CORRESPONDING MANUFACTURING METHOD

(75) Inventors: Antonino Sebastiano Alessandria, Catania (IT); Leonardo Fragapane, Catania (IT); Angelo Magri, Belpasso (IT)

(73) Assignee: STMicroelectronics S.R.L, Agrate Brianza, (MI) (IT)

( * ) Notice: Subject to any disclaimer, the term of this patent is extended or adjusted under 35 U.S.C. 154(b) by 97 days.

(21) Appl. No.: 10/993,917

(22) Filed: Nov. 19, 2004

(65) Prior Publication Data
US 2005/0145977 A1 Jul. 7, 2005

(30) Foreign Application Priority Data
Nov. 28, 2003 (EP) .................... 03425764

(51) Int. Cl.
*H01L 29/76* (2006.01)
(52) U.S. Cl. ...................... 257/330; 257/341
(58) Field of Classification Search .......... 257/330, 257/331, 341, 413, 488
See application file for complete search history.

(56) References Cited

U.S. PATENT DOCUMENTS

| 4,767,722 | A | | 8/1988 | Blanchard |
| 4,893,160 | A | * | 1/1990 | Blanchard .................... 257/334 |
| 5,168,331 | A | | 12/1992 | Yilmaz |
| 5,214,305 | A | * | 5/1993 | Huang et al. ................ 257/413 |
| 5,401,677 | A | | 3/1995 | Bailey et al. |
| 6,573,560 | B2 | * | 6/2003 | Shenoy ........................ 257/330 |
| 6,580,123 | B2 | * | 6/2003 | Thapar ........................ 257/330 |
| 7,045,858 | B2 | * | 5/2006 | Matsuda et al. ............. 257/330 |
| 2001/0006836 | A1 | | 7/2001 | Nakamura et al. |
| 2002/0130359 | A1 | | 9/2002 | Okumura et al. |
| 2002/0158287 | A1 | | 10/2002 | Fujishima et al. |

FOREIGN PATENT DOCUMENTS
EP 03425764.2 5/2004

* cited by examiner

*Primary Examiner*—Mark V. Prenty
(74) *Attorney, Agent, or Firm*—Hogan & Hartson LLP

(57) ABSTRACT

A semiconductor power device includes an insulated gate and a trench-gate structure. The trench-gate structure is formed on a semiconductor substrate covered by an epitaxial layer. The trench is formed in the semiconductor to form the device gate region. A dielectric coating is provided on the inner and bottom walls of the trench. The gate region includes a conductive spacer layer on the coating layer only on the inner walls of the trench.

14 Claims, 13 Drawing Sheets

SEMICONDUCTOR POWER DEVICE WITH INSULATED GATE AND TRENCH-GATE STRUCTURE AND CORRESPONDING MANUFACTURING METHOD

FIELD OF THE INVENTION

The present invention relates to a semiconductor power device having an insulated gate and an improved trench-gate structure, and a corresponding manufacturing method.

BACKGROUND OF THE INVENTION

As is known in the art, power devices of the IGBT type ("Insulated Gate Bipolar Transistor") are used in circuits requiring high voltage and current with a moderate switching frequency, such as motor control circuitry or the like.

The performance of an IGBT device combines the advantages of a bipolar transistor (high conductivity) and those of a field-effect MOS transistor (control voltage with high input resistance), wherein MOS transistor drives the base current of the bipolar transistor.

These IGBT devices can be generally manufactured in two versions: a first one called "planar gate" and another one called "trench-gate", whose cross-section can be seen in FIG. 1.

The structure of a "trench-gate" IGBT device includes a substrate 1 of a p+ type semiconductor material whereon an epitaxial layer is grown, split into buffer layer 2 and drift layer 3, of the n+ and n− type respectively. Two differently-doped p regions are formed on drift layer 3: a body region 4 and a deep body region 5. The n type source region 6 is integrated in the body region 5. Although FIG. 1 relates to an IGBT device, a Power MOS device could be illustrated by removing substrate layer 1.

The trench-gate structure is provided by a trench in the silicon filled in with a polysilicon layer to form gate region 7, which is separated from the other portions of the IGBT by a silicon oxide coating 8 grown on the trench walls. A deposit of dielectric 9 and a metal contact 10 complete the device, as is shown in FIG. 1.

Regions 1 and 3 are the conduction electrodes of the bipolar transistor, while the MOS transistor includes source 6, drift layer 3, and polysilicon gate 7.

The main advantages of a trench-gate device manufactured with planar technology are: the J-FET resistance is removed, with a subsequent decrease in conduction losses; and the possibility of considerably increasing the device integration scale, with a subsequent increase in current density.

On the other hand, the structure has some drawbacks. The trench lower portion causes a thickening of the electric field, with a subsequent worsening, for the same drift-layer thickness, of the device break-down voltage. A solution to this problem is providing the trench lower portion with a U-profile. This considerably improves the device break-down voltage. Also, the trench upper edge causes the formation of a beak during the gate oxide growth, which can be seen in FIG. 1 in the ring 12 and in a TEM image of the same region as is shown in FIG. 2. This unevenness causes a thickening of the electric field, due to the peak effect, with a subsequent worsening of the gate oxide break-down voltage.

A first prior art solution to solve the problem used a recessed polysilicon structure (etchback of the polysilicon protruding from the trench). In this way, the edge at the trench upper end is cut out from the device active part. This is shown in detail in FIG. 5, wherein a comparison with FIG. 1 clearly shows the effect of the polysilicon etchback even under the trench edge level, resulting in a concave surface 14.

Another solution is to round the trench upper edge, as is shown in FIG. 3, to avoid the formation of the oxide beak during the growth thereof. This solution, however, is technically more complex.

Moreover, the structure of a "trench-gate" IGBT device has additional drawbacks. The roughness of the trench vertical walls due to silicon etching causes damage of the carrier surface mobility, as well as a worsening of the gate oxide quality. In this case accurate cleaning processes and the growth of a sacrificial oxide on trench walls before forming the gate oxide, and the following removal thereof, improve both the surface mobility and the gate oxide quality. For the same device active area, a considerable increase of the gate oxide area occurs, even in areas wherein the channel is not formed (see the gate oxide portion 11 in FIG. 4). This involves an increase in the stray capacitance linked to the device gate terminal. This problem can be avoided by providing a thick oxide layer on the trench bottom. This solution improves both the device break-down (the oxide serves as a field-ring) and the gate oxide break-down, since the wall portion, wherein a variation of the silicon crystallographic orientation occurs, is excluded from the thin oxide area, and the stray capacitance linked to the gate terminal.

The structure resulting from these possible improvements is shown in FIG. 5 wherein region 13 is filled in with thick-oxide (gate oxide+deposited dielectric).

Although providing certain advantages, the solution discussed above involves considerable complexity due to trench filling with LTO, polysilicon etchback with controlled overetch, and other steps.

What is desired, therefore, is a manufacturing method for an insulated gate semiconductor power device with an improved trench-gate structure, that overcomes the drawbacks of the prior art methods discussed above.

SUMMARY OF THE INVENTION

According to an embodiment of the present invention a conductive spacer, such as a polysilicon spacer, is inserted into a trench-gate structure on the trench-gate inner walls.

According to an embodiment of the present invention a semiconductor power device with an insulated gate and improved trench-gate structure, of the type wherein the trench-gate structure is provided on a semiconductor substrate covered by an epitaxial layer and a trench in the semiconductor to form the device gate region, a dielectric coating is provided on the inner and bottom walls of the trench, and the gate region includes a polysilicon conductive spacer layer on the coating layer on the inner walls of the trench. The epitaxial layer under the trench may include a drain implant or an enrichment implant. A silicide layer on the polysilicon spacer defines the gate of the device, to decrease the distributed gate resistance. The trench bottom is free from polysilicon, and is filled in with an intermediate passivation dielectric that is completely contained in the trench. The body region and source region of the device are short-circuited to each other with a microtrench.

The features and advantages of the device and method according to the invention will be apparent from the following description of an embodiment thereof given by way of non-limiting example with reference to the attached drawings.

DETAILED DESCRIPTION

With reference generally to FIGS. 6–13, a power device 20 with an insulated gate and improved trench-gate structure is shown according to the an embodiment of the present invention including a conductive spacer, for example of polysilicon, and described in further detail below.

Figure 6:
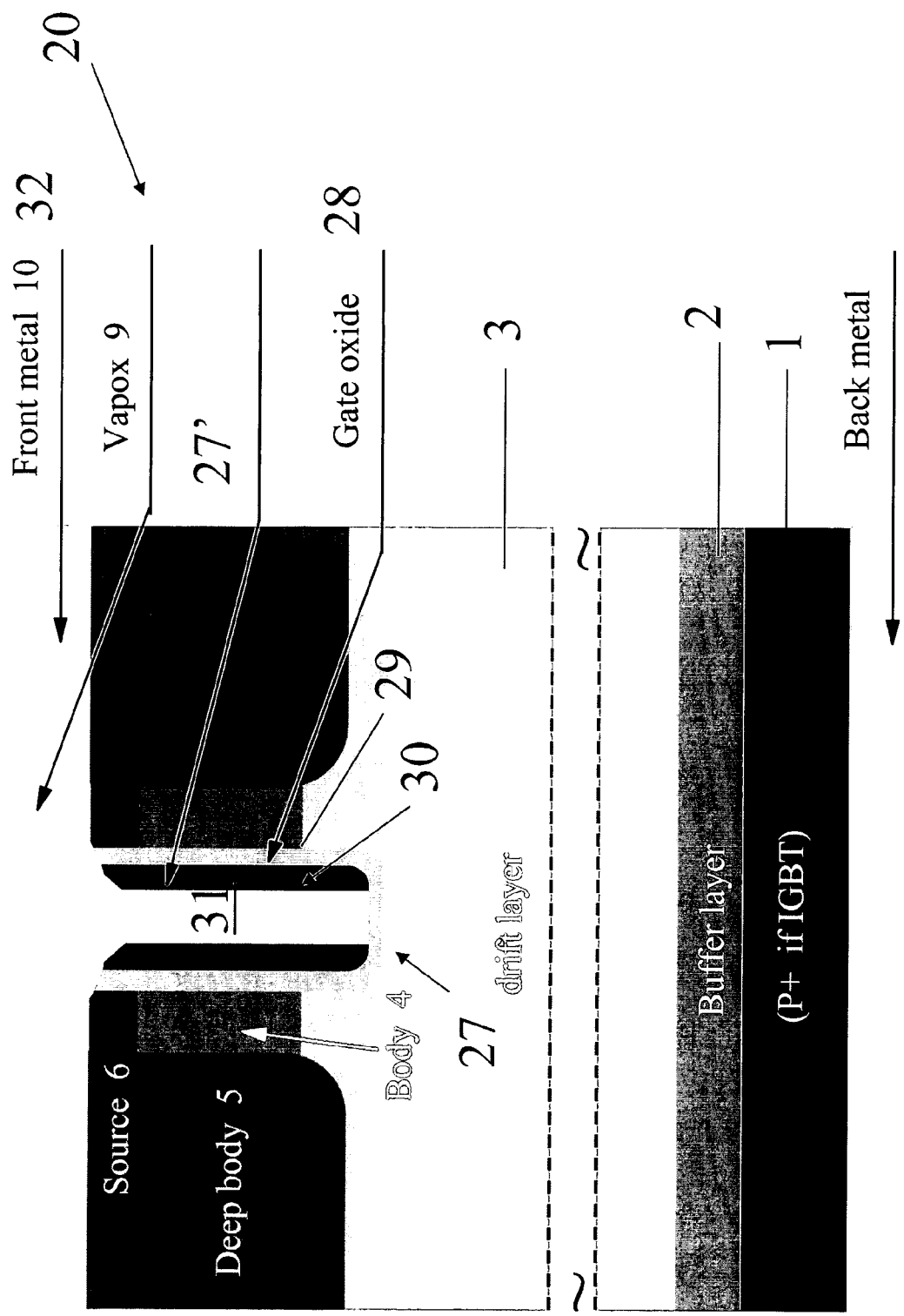
FIG. 6 is a schematic view of a device with the improved trench-gate according to the present invention.

Referring now to FIG. 6, the sequence of steps of the method according to the invention leading to the formation of a power device of the above-mentioned type is described.

The present invention can be implemented together with the integrated circuit manufacturing techniques presently used in this field and only those commonly used process steps being necessary to understand the invention are described hereafter.

The figures representing cross sections of a semiconductor device during the manufacturing are not drawn to scale, but they are instead drawn in order to show the important features of the invention.

Figure 8:
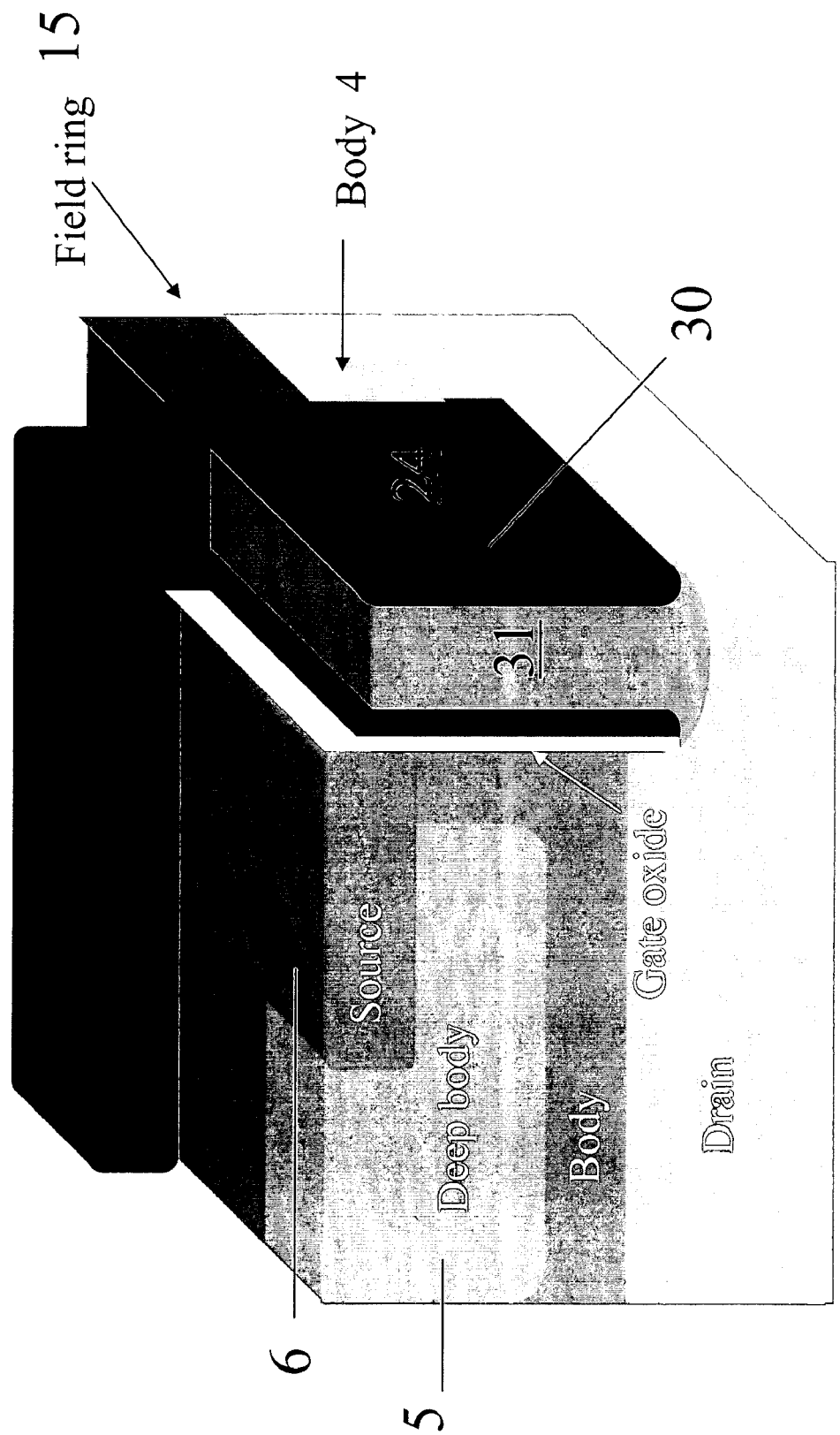
FIG. 8 is a three-dimensional schematic view of the device according to an embodiment of the present invention with a different polysilicon structure etching.

The method thus provides the following steps:
a starting substrate 1 of the N+ type for a MOS power or of the P+ type for an IGBT;
epitaxial growth of the N− type (drift layer) 3 with possible preventive growth of a buffer layer of the N+ type 2 at the interface with the substrate;
providing edge structures of the power device 20 by a field oxide and/or a field ring 15 of the P type implanted in the device peripheral region, as can be better seen in FIG. 8. This implant is also used for providing the device mesh;
exposure of the device active area by removing the thick oxide;
providing the body structure 4 by an unmasked p type implant;
providing the device deep body structure 5 by an p+ implant with a photoresist mask;
providing the source structure 6 by an n+ implant with a photoresist mask;
alignment of a hard mask for etching the semiconductor and forming a trench 29 to form the gate region;
dry anisotropic etching of the semiconductor to form a trench 29 having a U-profile in the lower or bottom portion;
hard mask removal;
cleaning and sacrificial oxidation of the inner walls of trench 29 with subsequent oxide removal;
formation of a coating layer 28 coating trench 29, to form a dielectric gate layer, for example through oxidation;
deposit of a conductive layer 27', for example of polysilicon, for the partial filling of the trench 29 (it is important that the trench is not completely closed, as it will be apparent from the following description);
formation of a conductive spacer 30 through dry anisotropic etching of the previously deposited layer 27' to define a gate 27 of the device 20. The etching has the end-point on the gate coating layer 28 both on the device top and in the trench 29 bottom;
filling of the trench 29 with an intermediate passivation dielectric 31; and
continuation of the manufacturing process to define front metallization contacts 32, final passivation and back metallization according to the prior art.

Ideally, coating layer 28 is an oxide layer, while conductive layer 27' is ideally a polysilicon layer.

The process flow being described applies to N-channel power devices with an insulated gate; nevertheless nothing prevents essentially the same steps from being used to provide a P-channel power device by using the opposite polarity substrate and implants.

Figure 7:
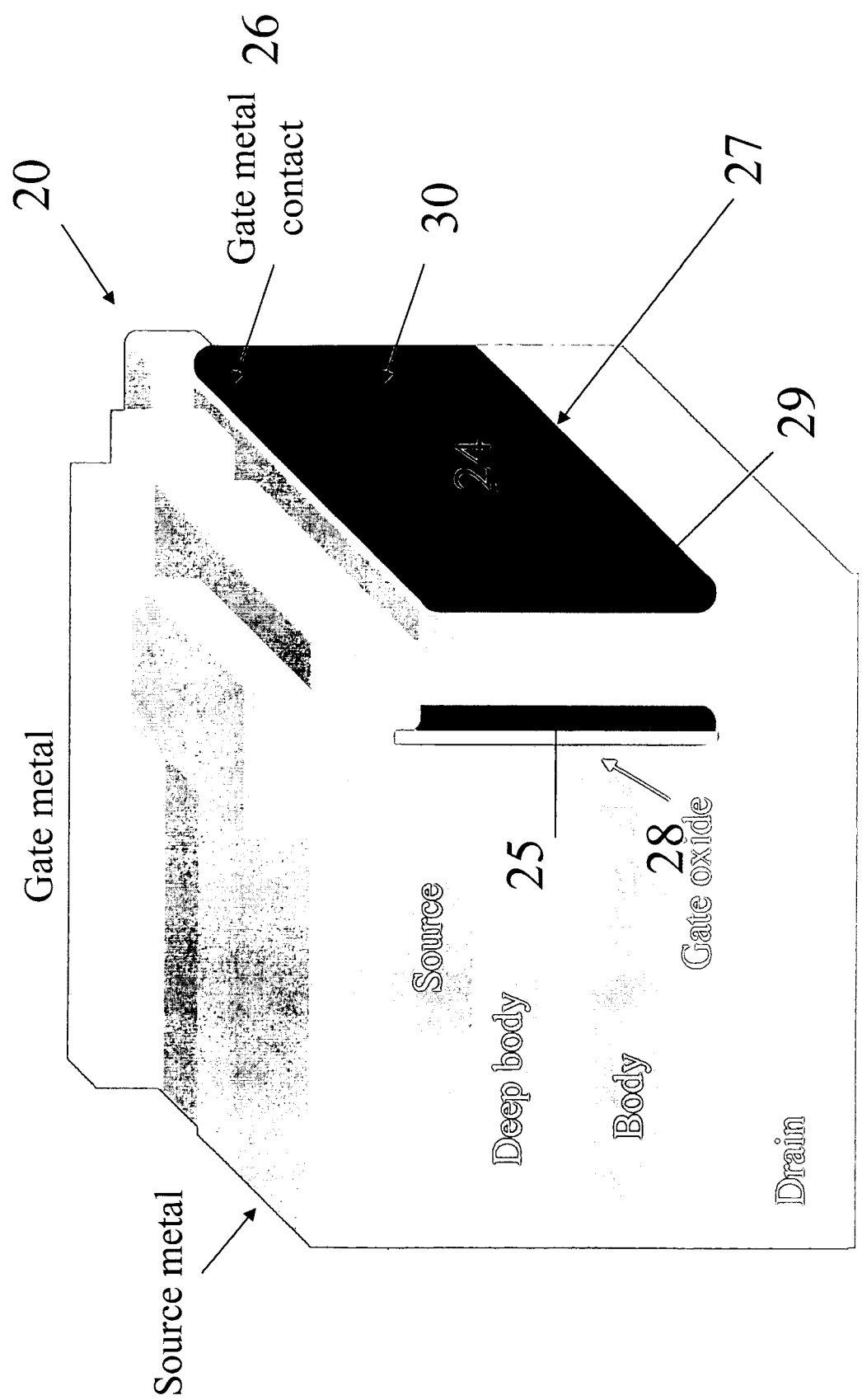
FIG. 7 is a three-dimensional schematic view of the device of FIG. 6 with the trench-gate according to the present invention.

The etching to form the polysilicon spacer 30 can be performed without a mask. As can be seen in FIG. 7, showing a three-dimensional sectional view of the device according to the invention, the device gate structure is formed by polysilicon stripes, two independent stripes 24, 25 for each trench, contacted by the metal gate 26 after etching the intermediate passivation 31 at the contact opening.

Therefore, spacer 30 includes the two independent conductive stripes 24, 25 being essentially parallel to each other, which are close to the coating layer 28 and formed only in correspondence with the trench 29 inner walls. It is important to note that spacer 30 is not formed on the bottom of trench 29.

Alternatively, the spacer 30 etching can be performed with a mask in order not to etch the polysilicon in the edge region to provide the gate contact and the field-plate 33 in region 26, as shown in FIGS. 7 and 8.

The use of the described structure according to an embodiment of the present invention has the following advantages, which are described below.

Figure 1:
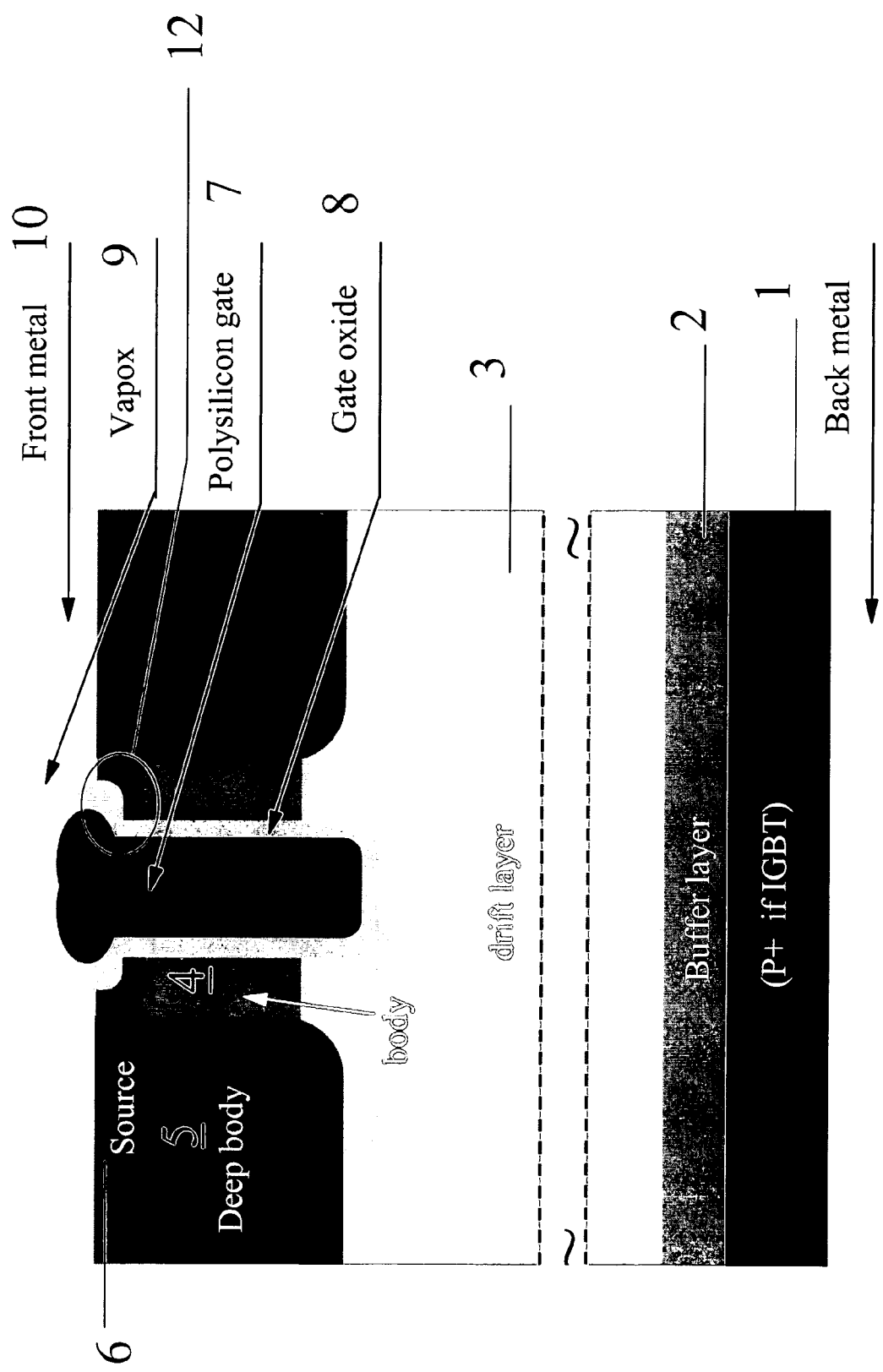
FIG. 1 is a cross-sectional schematic view of an IGBT or Power MOS power device with insulated trench-gate according to the prior art.
Figure 2:
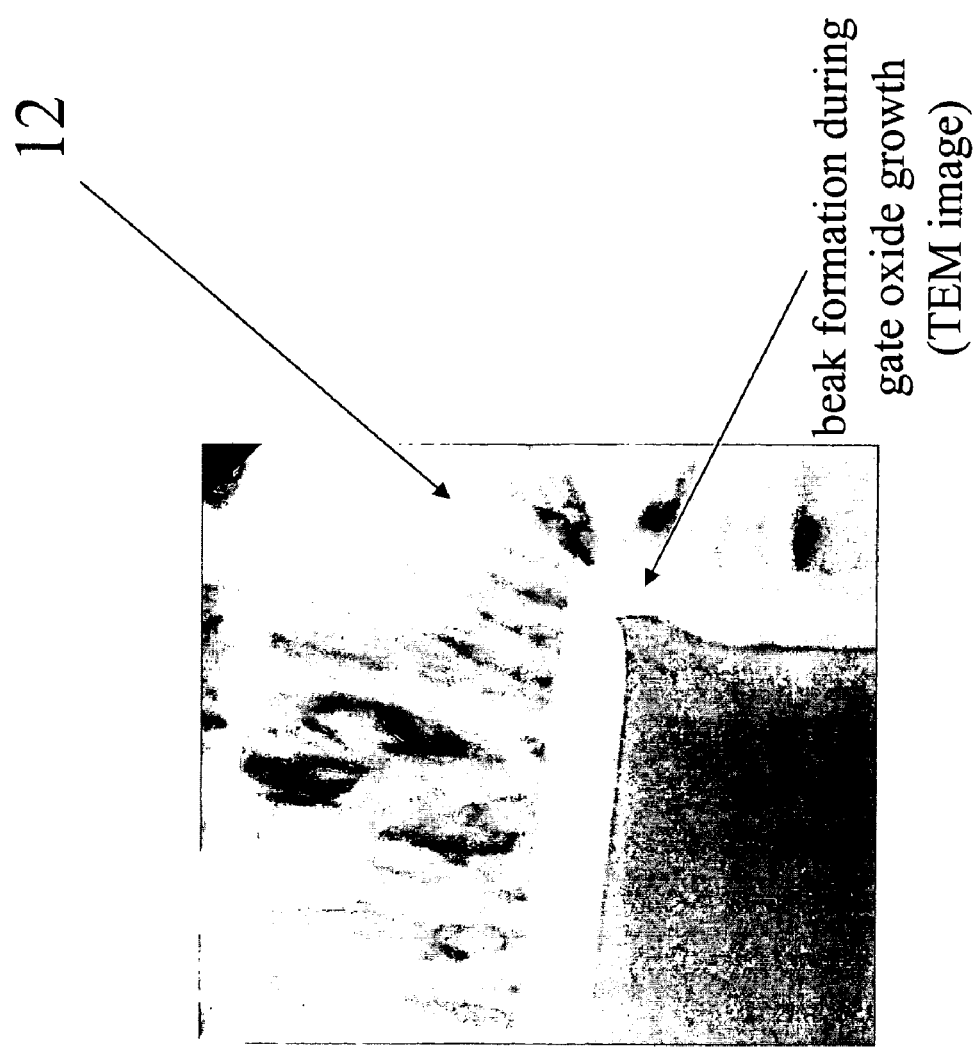
FIG. 2 is a TEM image of the circled area shown in FIG. 1.
Figure 3:
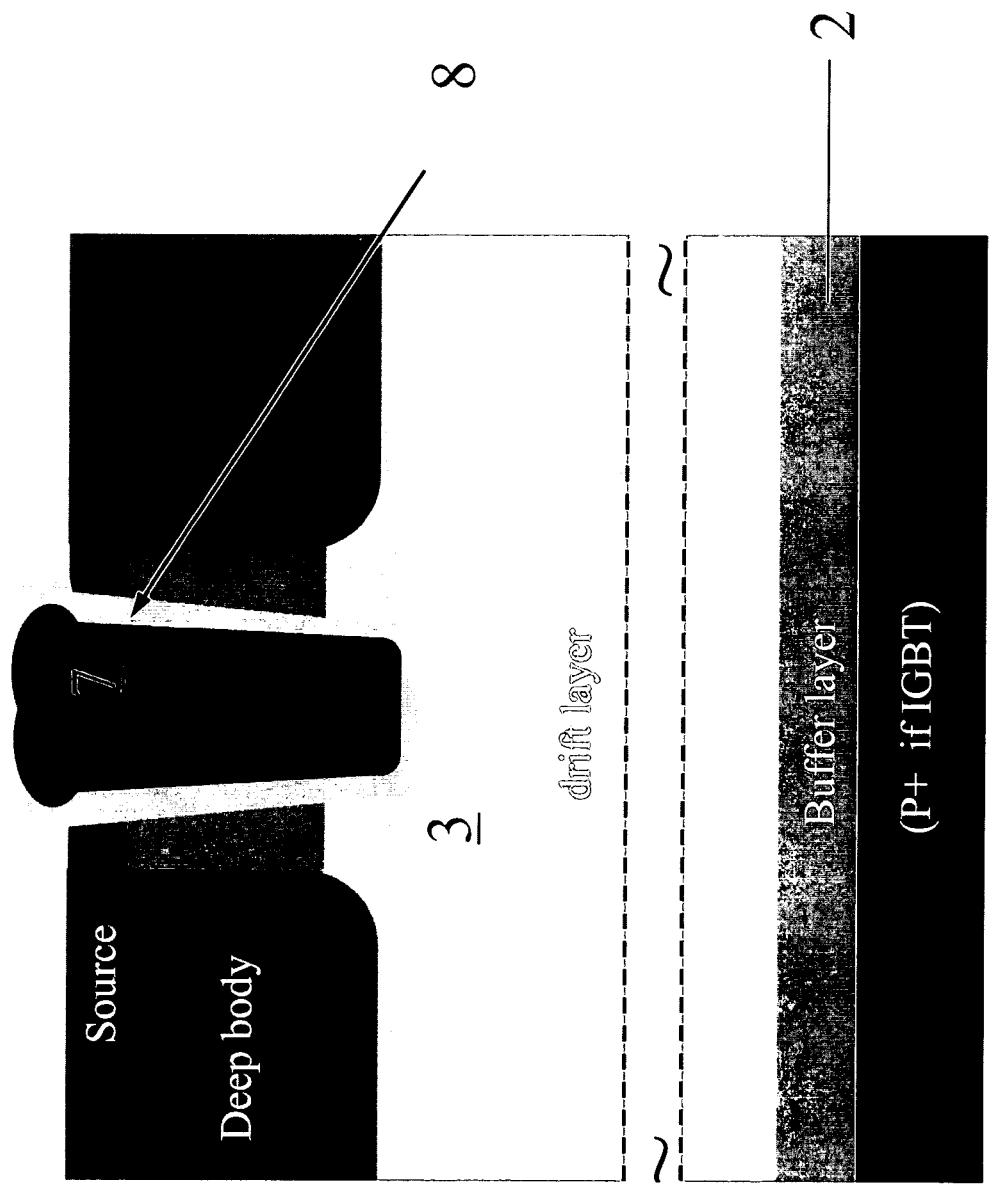
FIG. 3 schematically shows a possible known solution with sloping trench walls to avoid the bird-beak problem demonstrated in FIGS. 1 and 2.
Figure 4:
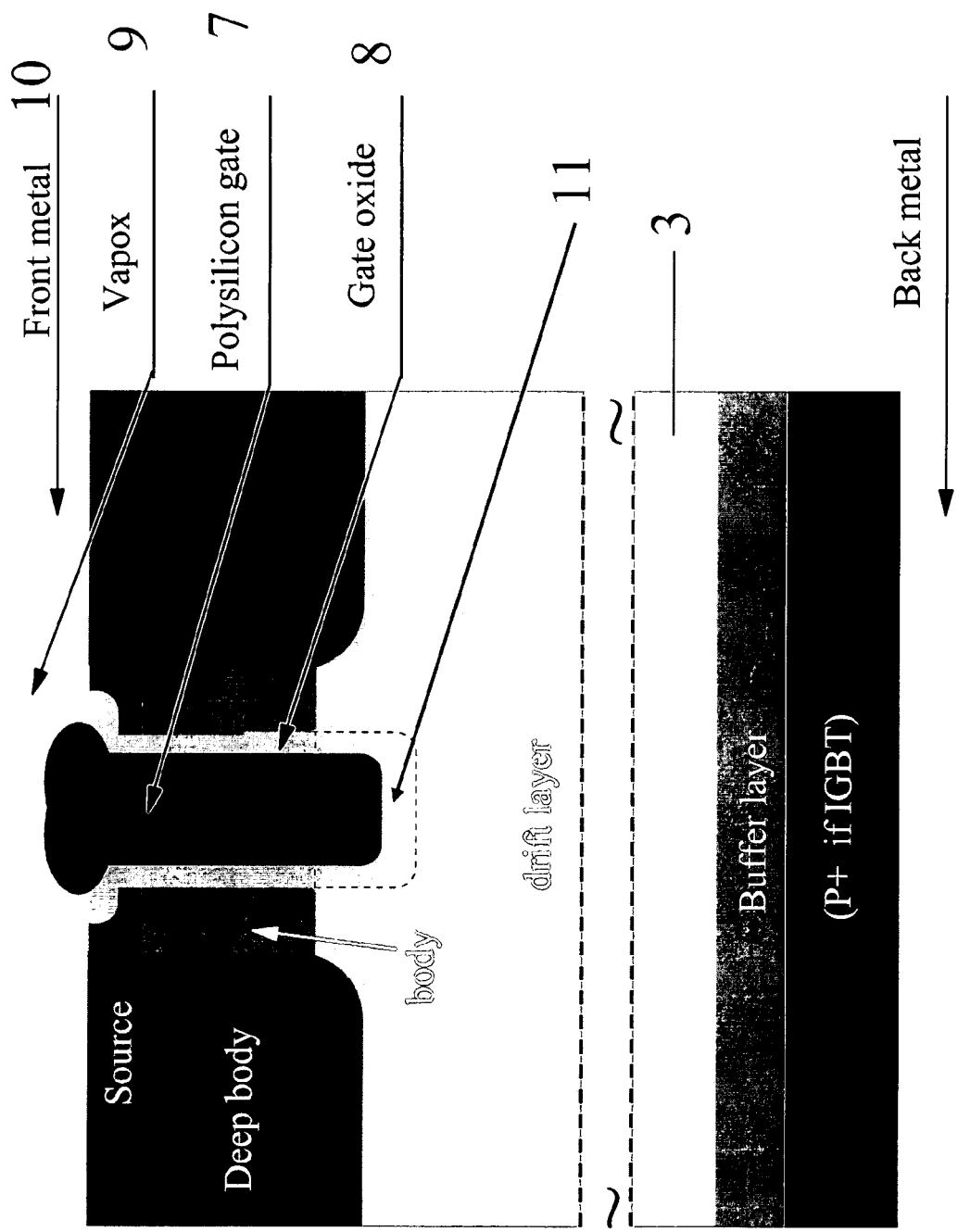
FIG. 4 schematically shows a further known solution providing a gate oxide region adding stray capacitance outside the channel region.

The problem linked to the oxidation of the trench upper edge is removed; in fact the polysilicon is recessed by the etching and the edge area does not belong to the active structure of the device gate, which is a considerable improvement with respect to the structure shown in FIG. 1.

The portion of the device active area covered by the gate oxide only concerns the channel region; in fact the polysilicon is recessed from the trench top and it is removed from the trench bottom; this involves a decrease in the stray capacitance linked to the device gate terminal, which is also a considerable improvement with respect to the structure shown in FIG. 1.

Figure 5:
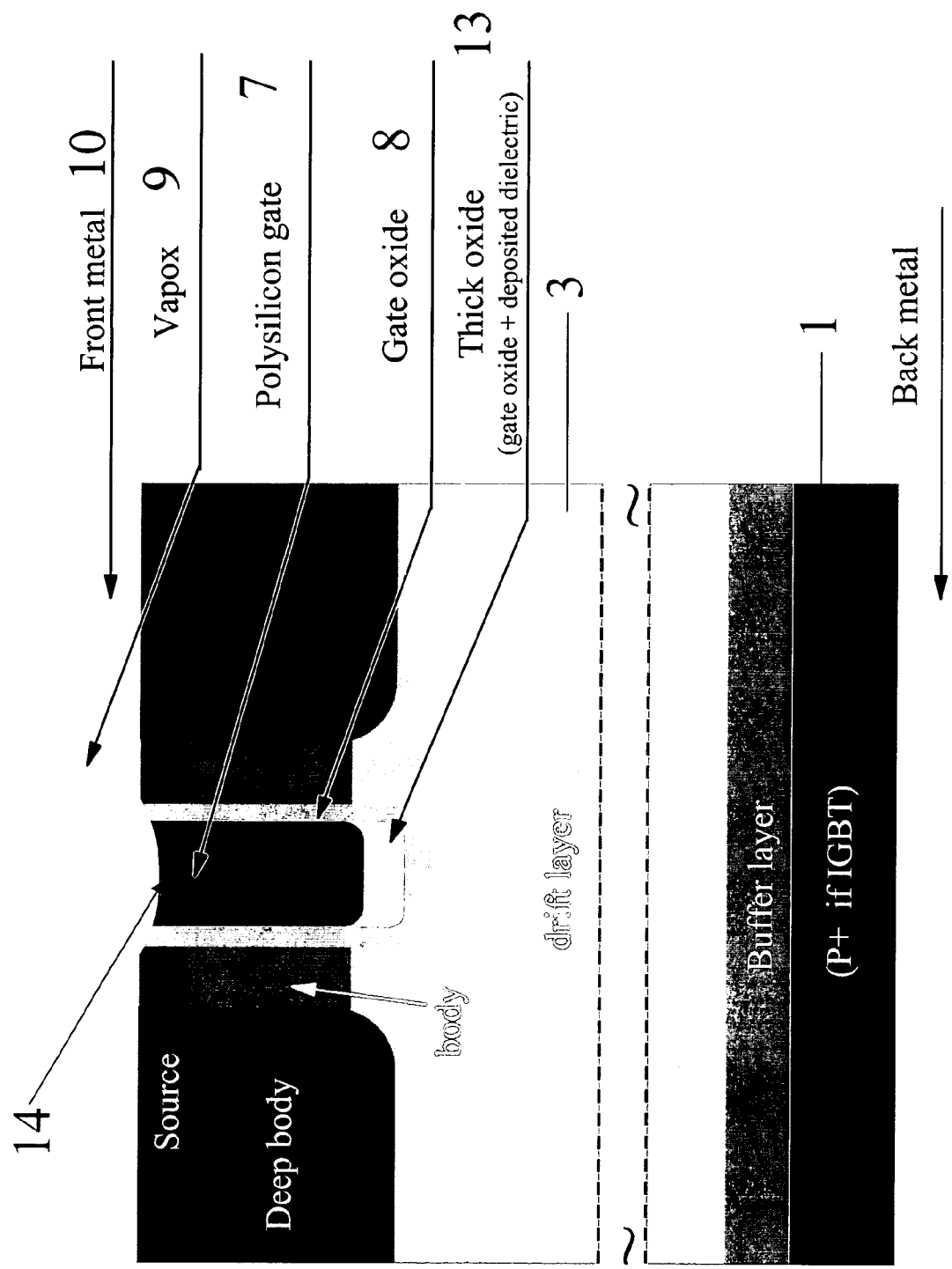
FIG. 5 schematically shows an improved structure with respect to FIG. 4 with recessed polysilicon and with the trench bottom being filled in with thick oxide.

The process used to provide the structure shown in FIG. 5 is simplified; in fact the process steps being necessary to provide the thick oxide 13 in the trench bottom are removed.

Moreover, the advantages achieved by realising the trench U-profile and those coming from the cleaning and sacrificial oxidation of trench walls are kept unchanged.

It must be noted that it is necessary to adjust the thickness of the deposited polysilicon layer with respect to the trench opening. In fact the polysilicon layer must not completely close the trench to allow the trench lower portion to be subsequently etched.

Moreover, as in the structure realised through polysilicon etchback, it is necessary that the thermal budget attributed to the dopant forming the device source is such that the source/body junction is deeper than the level whereto the polysilicon layer is recessed.

The final device structure shown in FIG. 6 can be further improved as is described in further detail below.

Figure 9:
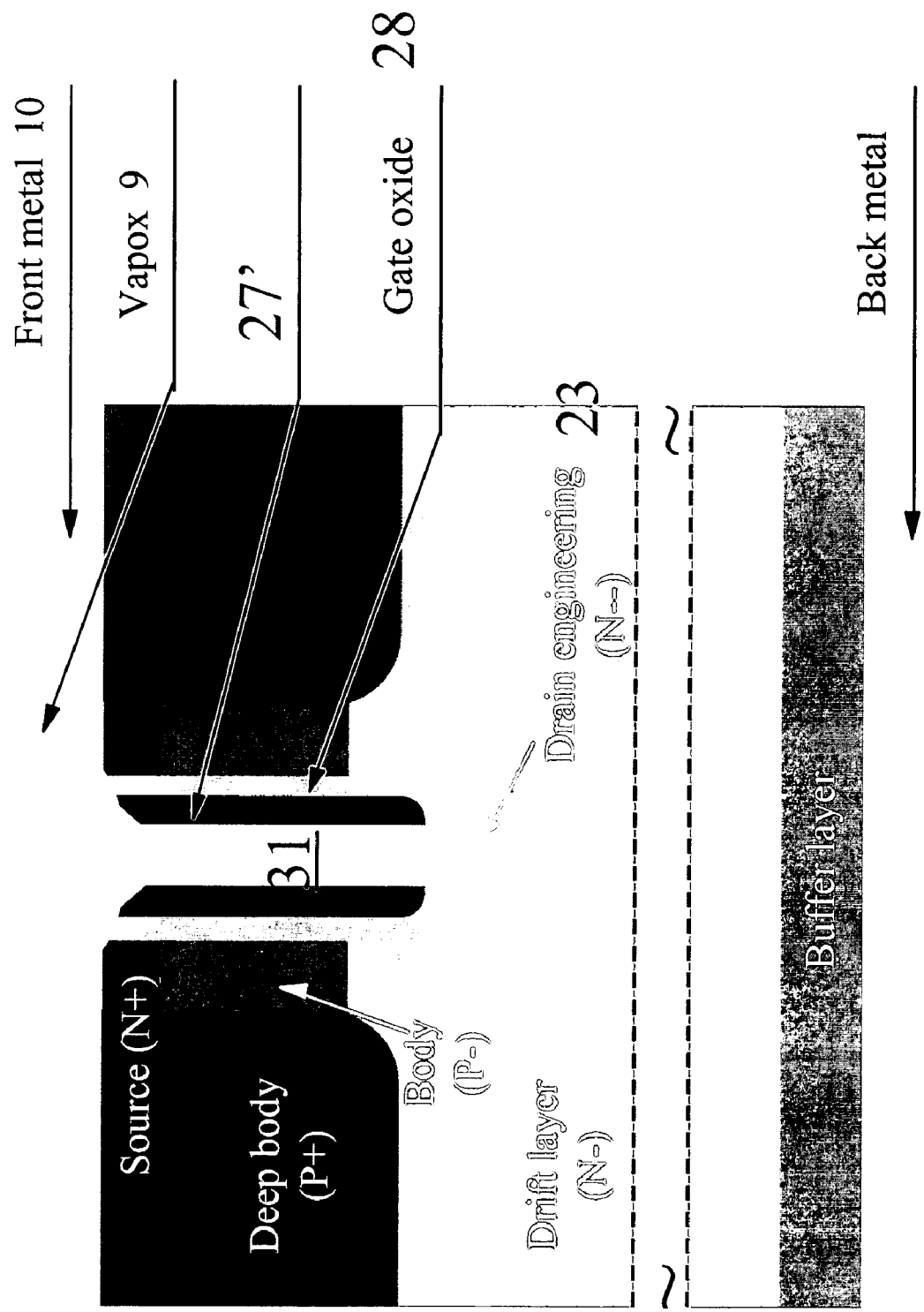
FIG. 9 is a cross-sectional schematic view of the device according to an embodiment of the invention with a drain engineering implant for a low-voltage MOS power device.

In the case of a low-voltage MOS power device, a "drain engineering" implant 23 can be used after forming the trench. This implant serves to impoverish the drift layer 3 region under the trench to impose, in the same region, a lower electric field slope. The resulting self-aligned structure is shown in FIG. 9.

Figure 10:
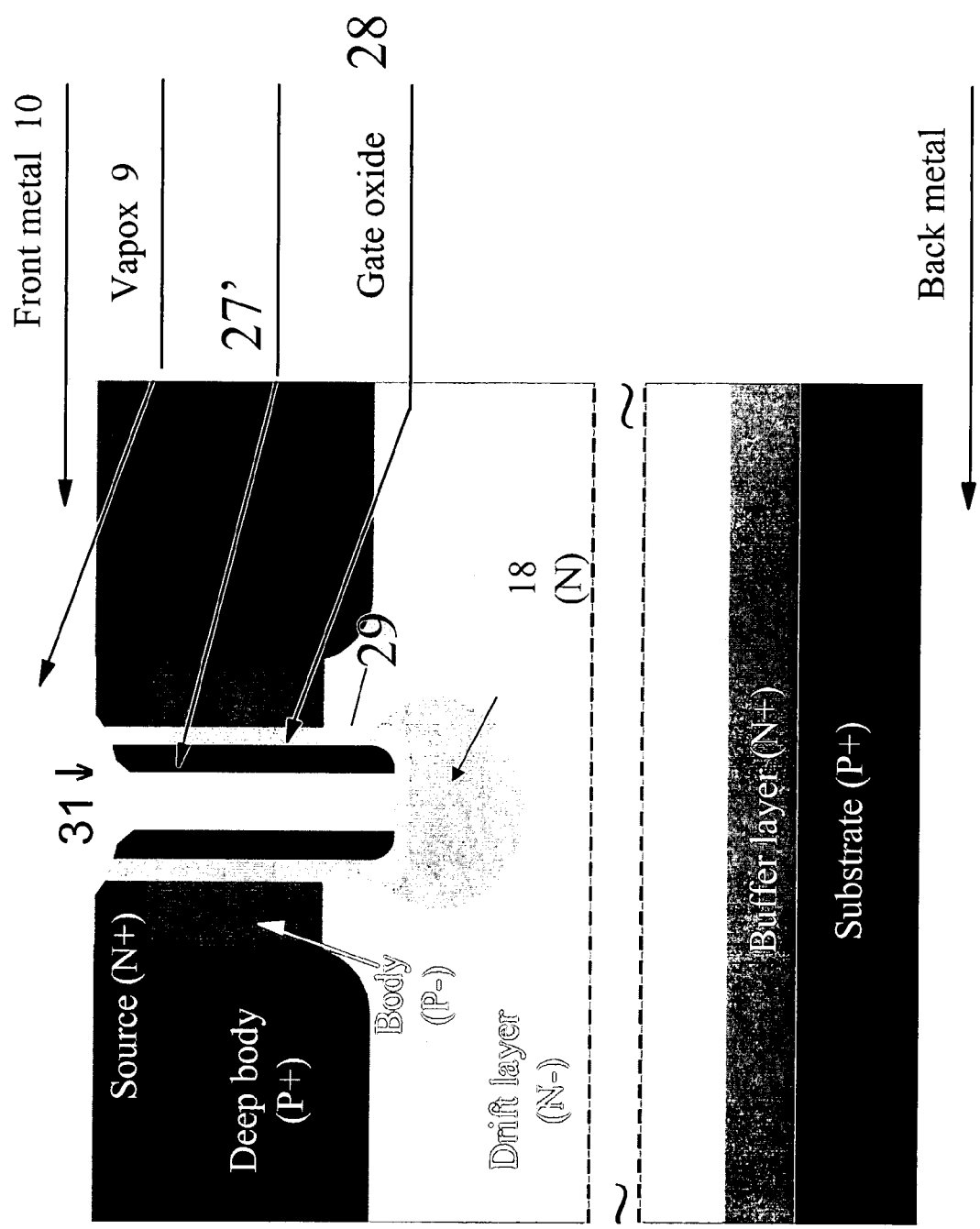
FIG. 10 is a schematic view of the device according to the invention with an additional enrichment for an IGBT.

In the case of an IGBT, an enrichment implant 18, as shown in FIG. 10, can be used after forming the trench in the drift layer 3 region under trench 29. This enrichment implant provides a PIN diode formed by the P+ regions of the substrate 1, N− regions of the drift layer 3 and $N_{enrichment}$ regions 18 under the trench. In this case, the structure is also self-aligned.

Figure 11:
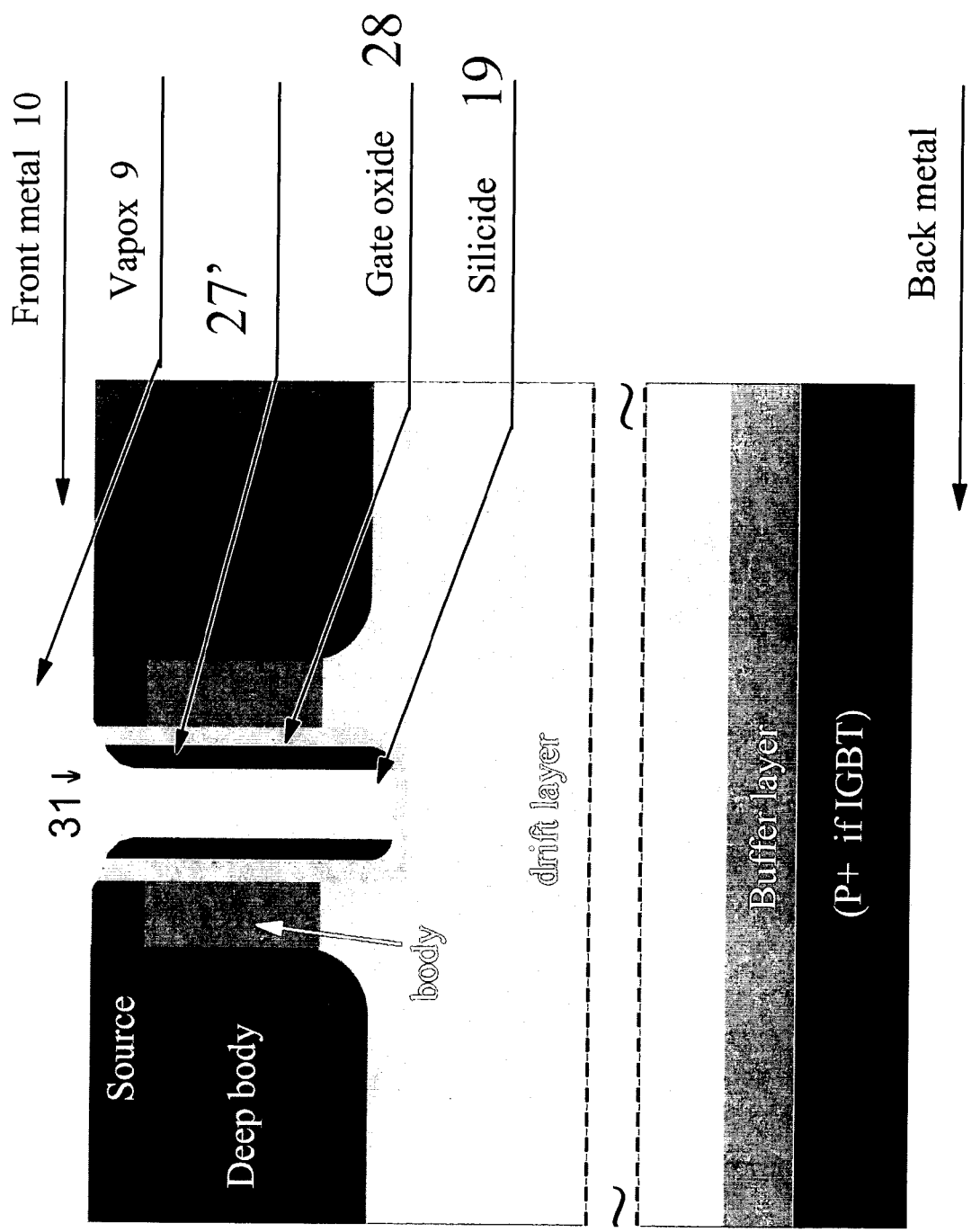
FIG. 11 is a cross-sectional schematic view of the device realised according to the invention with an additional silicide layer on the spacer.

Formation of a silicide layer 19, as shown in FIG. 11, on the polysilicon spacer 30 defining the gate 27 of the device 20, decreases the distributed gate resistance. This layer 19 is provided by sputtering a thin metal layer, sintering the silicide through a thermal process and removing the unsintered metal by aqua regia wet etching. In this case, the process is also self-aligned, i.e. it does not require additional phototechniques. In fact, the silicide layer is formed only on the polysilicon, since the remaining silicon is covered by the gate oxide, even in the trench bottom.

Figure 12:
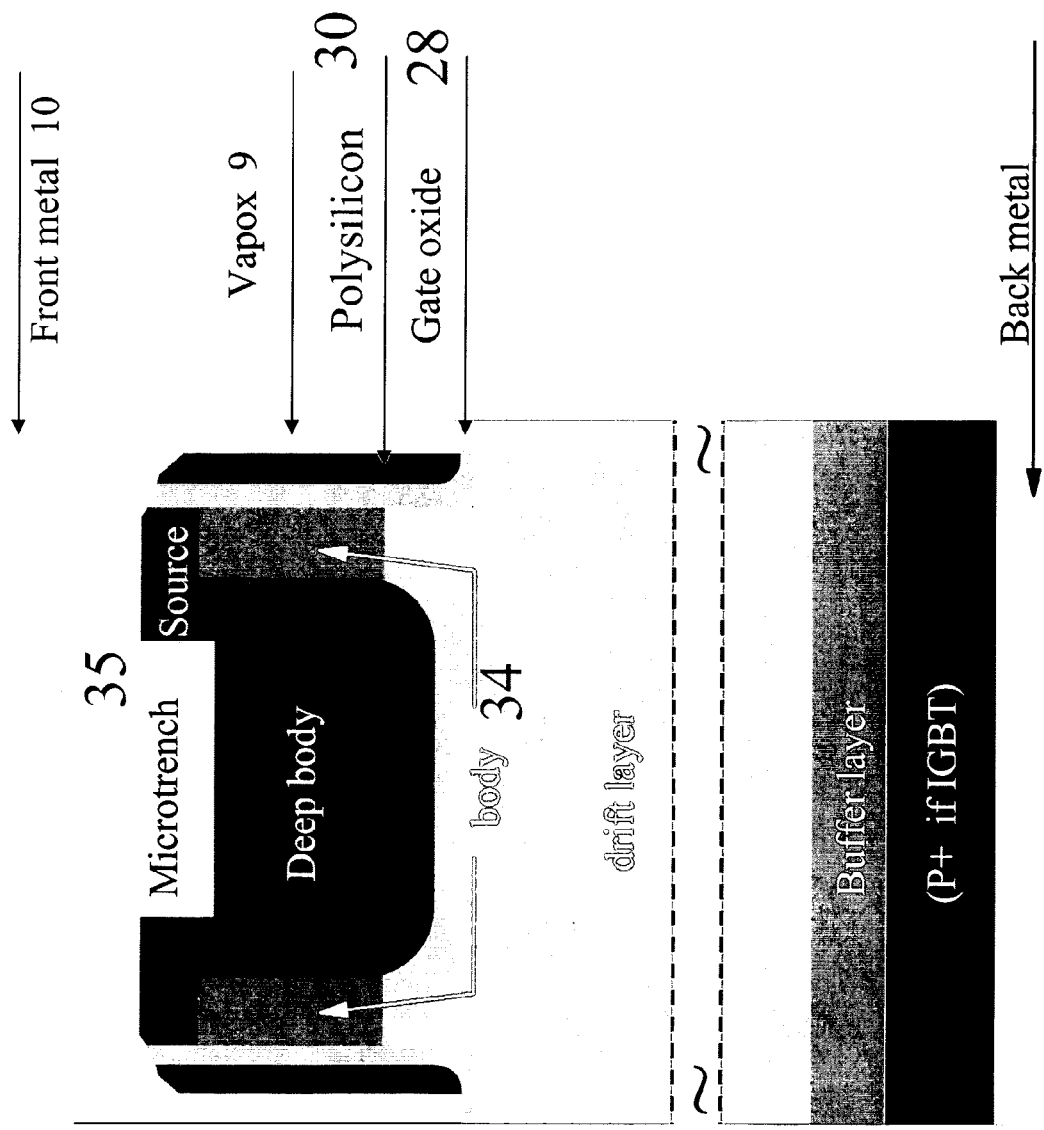
FIG. 12 is a cross-sectional schematic view of the device according to the invention with an additional microtrench to provide a body-source short.

In view of the reduction of the masks being used, the dopant constituting the source can be implanted without a mask and a body-source 34 short can be provided by means of a micro-trench 35 formed in the silicon in the contact opening step. The resulting structure is shown in FIG. 12 showing the portion between two trench-gates 27 including microtrench 35.

Figure 13:
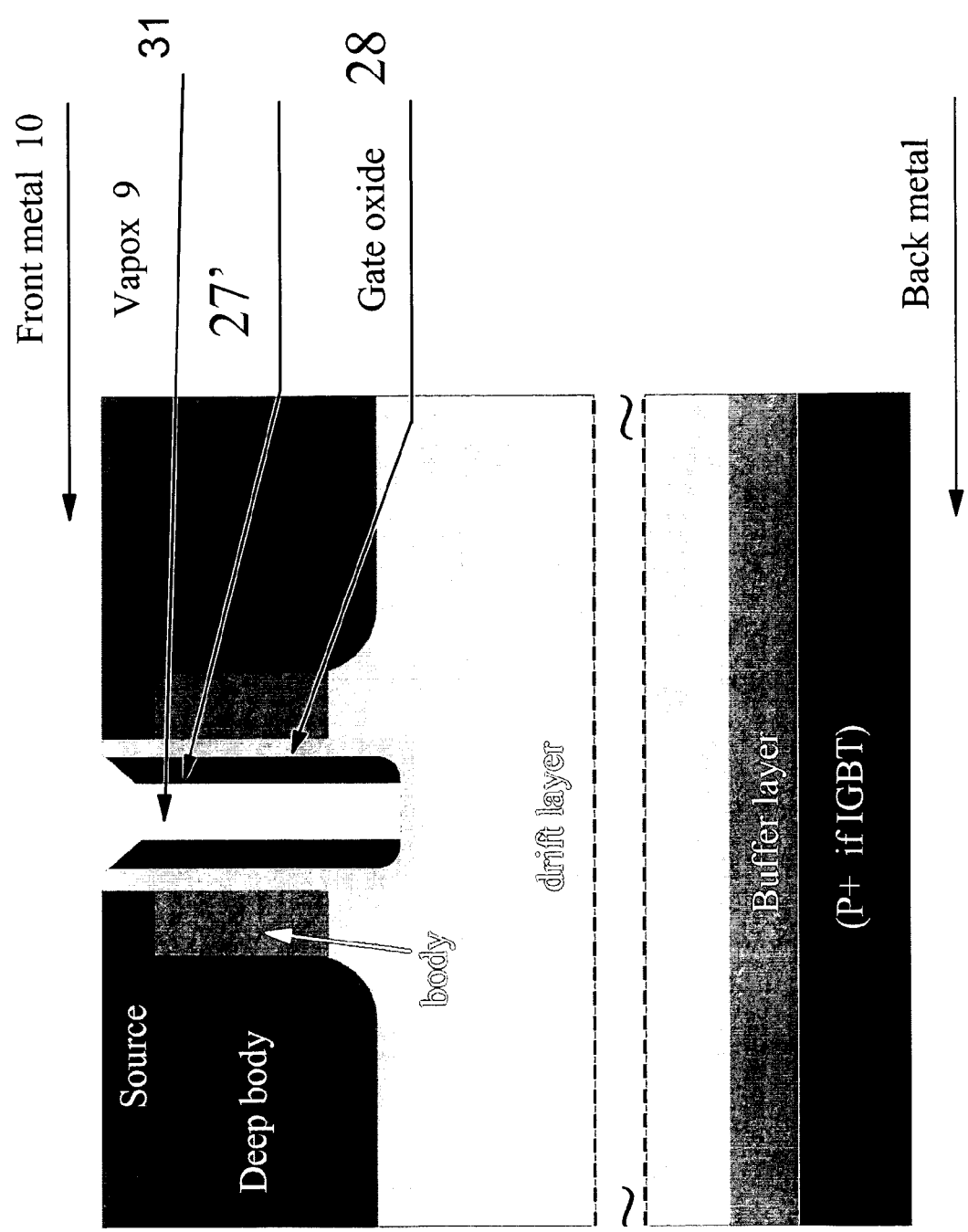
FIG. 13 shows the almost completed structure of the device according to the invention wherein the contact opening is performed through the etch-back of an intermediate passivation layer.

The contact opening can be performed through the etchback of the intermediate passivation dielectric 31. The intermediate passivation dielectric 31 is completely contained in the trench in the device 20 active area, as shown in FIG. 13. In this solution it is necessary to keep a convenient edge between the polysilicon recess level and the intermediate passivation dielectric etchback.

In conclusion, the device and method according to the invention solve the technical problem and they allow a semiconductor power device with insulated gate and trench-gate to be obtained, equipped with a conductive spacer, for example of polysilicon, and with better production yields and performance features than prior art solutions.

While there have been described above the principles of the present invention in conjunction with specific components, circuitry and bias techniques, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

The invention claimed is:

1. An insulated gate bipolar transistor (IGBT) semiconductor power device comprising:
   an insulated gate and trench-gate structure including a trench and a gate region wherein the trench-gate structure is formed on a semiconductor substrate of a first type of conductivity covered by an epitaxial layer of a second type of conductivity;
   a dielectric coating on the inner and bottom walls of the trench; a conductive spacer layer on said coating layer formed only on the inner walls of the trench;
   a self-aligned enrichment implant under the trench in the epitaxial layer; and
   a body region and a source region short-circuited by an electrode housed in a microtrench formed in the epitaxial layer, wherein the microtrench is deeper than the source region and less deep than the body region.

2. The IGBT semiconductor power device of claim 1, wherein the spacer layer comprises polysilicon.

3. The IGBT semiconductor power device of claim 2, further comprising a silicide layer on the spacer layer defining the gate of the device.

4. The IGBT semiconductor power device of claim 2, wherein the trench bottom does not comprise polysilicon.

5. The IGBT semiconductor power device of claim 1, wherein the trench is filled in with an intermediate passivation dielectric.

6. The IGBT semiconductor power device of claim 5, wherein the intermediate passivation dielectric is completely comprised in the trench.

7. An IGBT device according to claim 2, wherein the conductive spacer layer is in electric contact with a field plate formed on the epitaxial layer.

8. An IGBT semiconductor power device comprising:
   a insulated gate and trench-gate structure including a trench and a gate region wherein the trench-gate structure is formed on a semiconductor substrate of a first type of conductivity covered by at least an epitaxial layer of a second type of conductivity;

a dielectric coating on the inner and bottom walls of the trench;

a vertical conductive spacer layer comprising a silicide layer on said coating layer only in correspondence with the inner walls of the trench; and a self-aligned enrichment implant under the trench in the epitaxial layer, wherein the conductive spacer layer is in electric contact with a field plate formed on the epitaxial layer.

9. An IGBT semiconductor power device comprising:

a insulated gate and trench-pate structure including a trench and a pate region wherein the trench-gate structure is formed on a semiconductor substrate of a first type of conductivity covered by at least an epitaxial layer of a second type of conductivity;

a dielectric coating on the inner and bottom walls of the trench;

a vertical conductive spacer layer comprising a silicide layer on said coating layer only in correspondence with the inner walls of the trench; and a self-aligned enrichment implant under the trench in the epitaxial layer, wherein a body region and a source region are short-circuited by an electrode housed in a microtrench formed in the epitaxial layer, the microtrench being deeper then the source region and less deep then the body region.

10. An IGBT semiconductor power device comprising:

a insulated gate and trench-gate structure including a trench and a gate region wherein the trench-gate structure is formed on a semiconductor substrate of a first type of conductivity covered by at least an epitaxial layer of a second type of conductivity;

a dielectric coating on the inner and bottom walls of the trench, a conductive spacer layer on said coating layer only in correspondence with the inner walls of the trench, the conductive spacer layer being in electric contact with a field plate formed on the epitaxial layer, and a self-aligned enrichment implant under the trench in the epitaxial layer.

11. An IGBT device according to claim 10, wherein the trench is filled in with intermediate passivation dielectric.

12. An IGBT device according to claim 11, wherein the device comprise a body region and a source region short-circuited by an electrode housed in a microtrench formed in the epitaxial layer, wherein the microtrench is deeper then the source region and less deep then the body region.

13. An IGBT device according to claim 11, wherein the intermediate passivation dielectric is completely comprised in the trench.

14. An IGBT device according to claim 10, further comprising a silicide layer on the conductive layer defining the gate of the device.

* * * * *